(12) United States Patent
Lawlyes

(10) Patent No.: US 6,565,365 B2
(45) Date of Patent: May 20, 2003

(54) HIGH DENSITY WIREBOND CONNECTOR ASSEMBLY

(75) Inventor: Daniel A. Lawlyes, Kokomo, IN (US)

(73) Assignee: Delphi Technologies, Inc., Troy, MI (US)

(*) Notice: Subject to any disclaimer, the term of this patent is extended or adjusted under 35 U.S.C. 154(b) by 0 days.

(21) Appl. No.: 09/850,626

(22) Filed: May 7, 2001

(65) Prior Publication Data

US 2001/0031569 A1 Oct. 18, 2001

Related U.S. Application Data

(63) Continuation-in-part of application No. 09/467,502, filed on Dec. 20, 1999.

(51) Int. Cl.[7] .............................................. H01R 12/00
(52) U.S. Cl. ...................................... 439/76.1; 439/79
(58) Field of Search ........................ 439/76.1, 76.2, 439/79

(56) References Cited

U.S. PATENT DOCUMENTS

| | | | | |
|---|---|---|---|---|
| 4,434,321 A | * | 2/1984 | Betts ........................ 174/254 |
| 4,702,708 A | * | 10/1987 | Reuss et al. ................ 439/76.1 |
| 5,263,880 A | * | 11/1993 | Schwarz et al. ........... 439/76.1 |
| 5,609,491 A | * | 3/1997 | Cooper et al. ................ 439/79 |
| 5,764,487 A | * | 6/1998 | Natsume .................... 439/76.2 |
| 5,967,802 A | * | 10/1999 | Daly et al. ................. 439/76.1 |

* cited by examiner

Primary Examiner—Tulsidas Patel
(74) Attorney, Agent, or Firm—Jimmy L. Funke

(57) ABSTRACT

A high density wirebond connector assembly (10), is provided including an enclosure (12), a circuit board (14), a high density connector (16), a connector housing (18), and a plurality of pin contacts (20). Every two rows of pin contacts (20) merge onto a single shelf (22) to provide a high density contact surface (31). The circuit board (14) is comprised of a plurality of laminate layers (32) and rows of wirebond pads (34) positioned on the laminate layers (32). A plurality of wirebonds (36) run between individual pin contacts (20) and individual wirebond pads (34). By creating a high density contact surface (31) in combination with decreasing the distance between the wirebond pads (34) and the pin contacts (20), a smaller, lighter, cheaper, and vibrationally resistant high density connector assembly (10) is provided.

19 Claims, 2 Drawing Sheets

HIGH DENSITY WIREBOND CONNECTOR ASSEMBLY

This application is a CIP of Ser. No. 09/467,502 filed Dec. 20, 1999.

TECHNICAL FIELD

The present invention relates generally to a high density connector assembly and more particularly to improvements in a wirebonded high density connector assembly.

BACKGROUND ART

High density connectors are well known in the electronic industry as well as the automotive industry. In both industries the need for complex electrical connections must be married with an ever increasing need for the minimization of the size and weight of all parts. These needs have lead to the development of high density connectors. High density connectors provide a large number of individual electrical connections located within reduced size connector components. Although developments in high density connectors have lead to known improvements in connector density, minimization of their size has been limited by the ability to attach such connectors to the circuit boards to which they provide electrical communication.

Each individual electrical connection within a high density connector must be provided with a unique electrical path to the circuit board. Known methods of providing such pathways, such as solder connections, often create limitations on the layout and size of the high density connector. The electrical pathways created by solder and other conventional methods require surface areas that are known to prevent the individual connections within the high density connector from being placed too close to one another. A method of connection, however, is known that utilizes very thin connections to create pathways between a high density connector and a circuit board. This method is known as wirebonding. The electrical pathways created by wirebonding have small cross-sectional areas and may be placed within close proximity to each other. These characteristics make wirebonding highly suitable for use with high density connectors.

Although the scale of individual wirebonds make them naturally suitable for use with high density connectors, they have additional characteristics that have served to limit their use and have restricted the size and density of high density connectors employing them. The thin arcs of metal created by wirebonding become fragile when the distance between connection points becomes either too great or the arcs cover too great a vertical distance. This characteristic limits the use of wirebonding in applications that may be exposed to vibrations. Applications within industries such as the automotive industry often require their electrical components to survive environments with vibrational characteristics that prevent the use of such long wirebonds.

It is known that to circumvent the vibrational deficiencies of long wirebonds the high density connectors used in such environments may be limited to two rows of pins within the connector. Although this limits the length of the wirebonds, it requires longer connectors to accommodate a given number of electrical connections. Since size and density of such connectors is often a primary characteristic, such solutions are undesirable. High density connectors with three and four rows of connections often require pathways to the circuit boards on both sides of the high density connector. This limits the size and design flexibility of such connectors making such solutions undesirable for many applications.

Another method of compensating for the lack of vibrational resiliency in wirebonds is through the use of complex connector designs. One common connector design uses pin elements within the high density connector. A clear pathway from the ends of these pins to the circuit board must exist to create the wirebond. To accommodate these pathways the geometry and size of the multi-row connectors are restrained. One known method to accommodate such pathways utilizes staggered spacing between rows of connectors. This is undesirable since it requires a greater area for a given number of connections. Another known method places the connection points on surfaces 90 degrees to each other. While this decreases the length of the wirebonds, present designs often increase the vertical distance of the wirebonds and therefore can have undesirable vibrational characteristics.

Therefore, there is a need for a high density connector that can utilize the positive characteristics of wirebonding to create a highly dense connection pattern, while eliminating the poor vibrational characteristics, size limitations, and manufacturing costs associated with known designs.

SUMMARY OF THE INVENTION

It is therefore an object of the present invention to provide a high density wirebond connector assembly that improves the connection density. It is a further object of the present invention to provide a high density wirebond connector assembly that reduces the assembly's sensitivity to vibration, reduces the assembly's size, and reduces the cost of the assembly's manufacture.

In accordance with the objects of this invention, a high density wirebond connector assembly is provided. The high density wirebond connector assembly includes a connector housing containing a plurality of pin contacts. Every two rows of pin contacts merge onto one shelf to provide a high density connector contact surface. The connector housing is comprised of a plug end for electrical communication with an outside source and a shelf end for electrical communication with a circuit board.

The high density wirebond connector assembly further includes a circuit board containing a plurality of laminate layers. A plurality of wirebond pads form signal contacts for each of the pin contacts. The wirebond pads are positioned on at least two of the laminate layers so that the distance between any single wirebond pad and its corresponding pin contact is minimized. By placing groups of wirebond pads on separate layers of laminate, the wirebond pads can be placed in close proximity to each other and may be positioned in close proximity to their corresponding pin contact.

The high density wirebond connector assembly also includes a plurality of wirebonds. The wirebonds connect each individual pin contact with its corresponding wirebond pad and provide electrical communication between these elements.

Other objects and features of the present invention will become apparent when viewed in light of the detailed description of the preferred embodiment when taken in conjunction with the attached drawings and appended claims.

DESCRIPTION OF THE PREFERRED EMBODIMENT (S)

Figure 1:
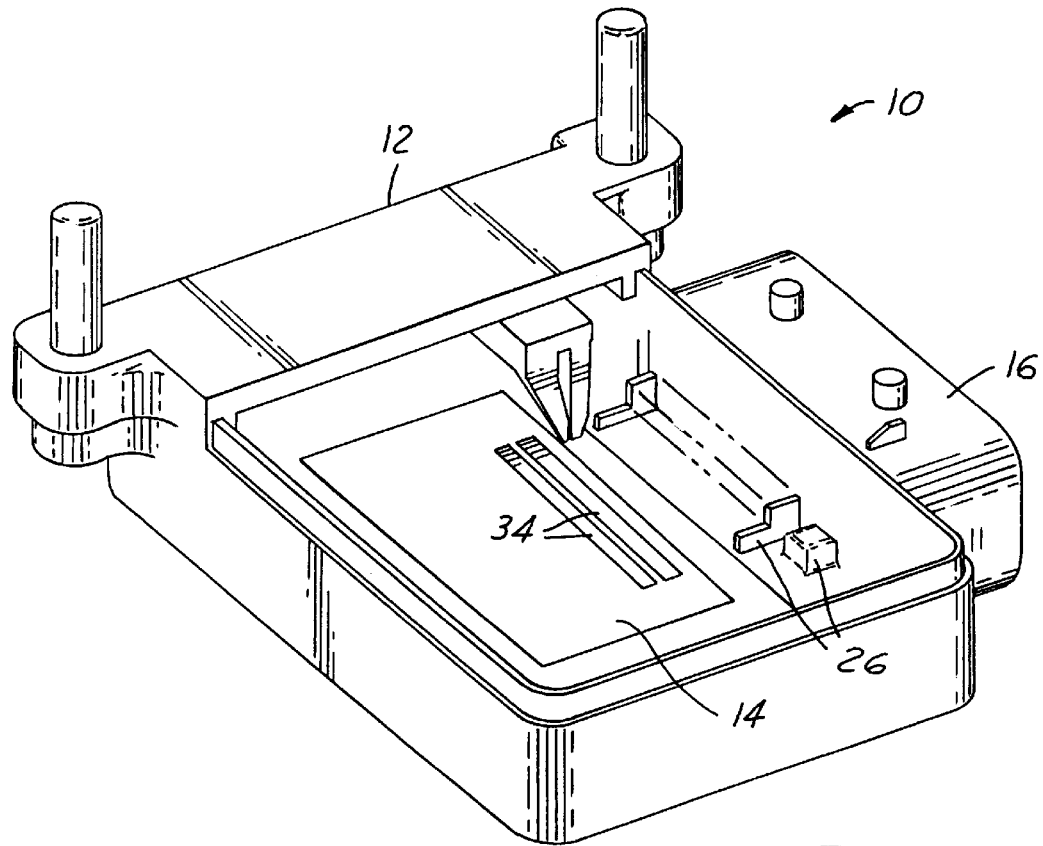
FIG. 1 is an illustration of a high density wirebond connector assembly in accordance with the present invention.

Referring now to FIG. 1, which is an illustration of a high density wirebond connector assembly 10 in accordance with the present invention. The disclosed high density wirebond connector assembly 10 is preferably for use in automotive electrical applications. The disclosed high density wirebond connector assembly 10 is intended for use in conjunction with automotive engine control modules and transmission control modules. However, the disclosed high density wirebond connector assembly 10 may be used in a variety of electrical applications in and out of the automotive industry.

The high density wirebond connector assembly 10 includes an enclosure 12, a circuit board 14, and a high density connector 16. The high density connector 16 is attached to the enclosure 12 through the use of adhesives. Although the high density connector 16 is preferably attached with adhesives, there are other well known methods of attaching the high density connector 16 to the enclosure to prevent significant movement of the high density connector 16 during use of the high density wirebond connector assembly 10 that may be utilized in accordance with the present invention.

Figure 2:
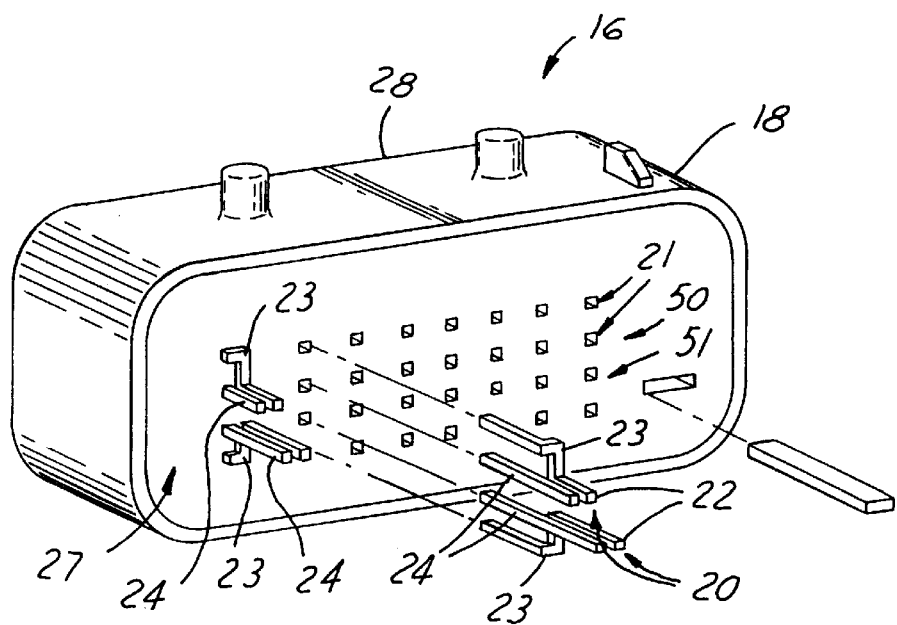
FIG. 2 is a perspective view of the high density wirebond connector of FIG. 1, in accordance with the present invention.

Referring now to FIG. 2, which is a perspective view of one embodiment of the high density connector 16. The high density connector 16 is comprised of a connector housing 18 and a plurality of pin contacts 20. The pin contacts 20 are formed such that two rows 21 of pin contacts 20 merge onto a single shelf 22 to provide a high density contact surface 31. In one embodiment, the pin contacts 20 are merged by using an alternating combination of angular shaped pins 23 and straight pins 24. A wide variety of configurations, however, are contemplated in order to merge two rows 21 of pin contacts 20 onto a single shelf 22. In one embodiment, four rows of pin contacts 20 are designed to form a top shelf 50 and a bottom shelf 51. It is contemplated that the pin contacts 20 for use in the bottom shelf 50 will be of greater length than those used in the top shelf 51 to in order to accommodate a bond tool and the clearances of the wirebonds.

The pin contacts 20 may be secured to the housing 18 using a variety of known methods. One contemplated method, known in the prior art, utilizes ports 25 formed in the housing 18 that are designed to increase downward forces on the pin contacts 20 and thereby secure them into the housing 18. Furthermore, in one embodiment a base 26 will support the pin contacts 20 on their given shelves 22 (see FIG. 1).

Figure 3:
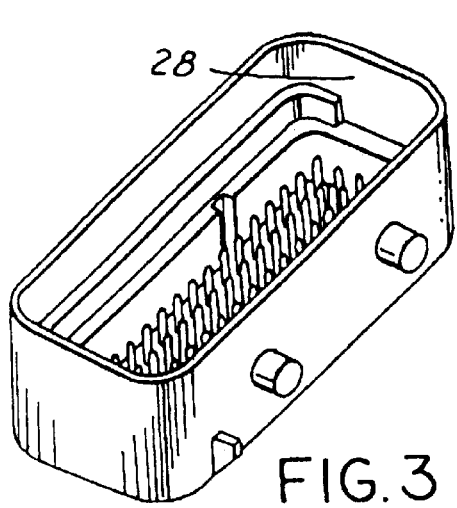
FIG. 3 is a perspective view of an embodiment of a high density wirebond connector in accordance with the present invention.
Figure 4:
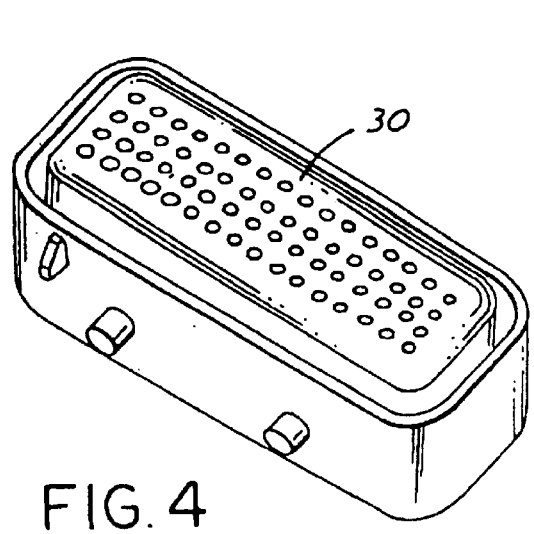
FIG. 4 is a perspective view of an embodiment of a high density wirebond connector in accordance with the present invention.

In addition to the shelf end 27 that provides a high density contact surface, the connector housing 18 also includes a plug end 28 (see FIG. 3), illustrated in a male configuration, to facilitate the marriage of the high density connector 16 with a female plug 30 (see FIG. 4) to provide electrical communication with a source outside the high density wirebond connector assembly 10. In an alternate embodiment, the plug end 28 can be the female plug 30 to allow a male plug to provide communication with an outside source. Although the plug end 28 of the high density connector 16 has been illustrated in a particular configuration, a variety of other known high density connection methods may be utilized on the plug end 28.

Figure 5A:
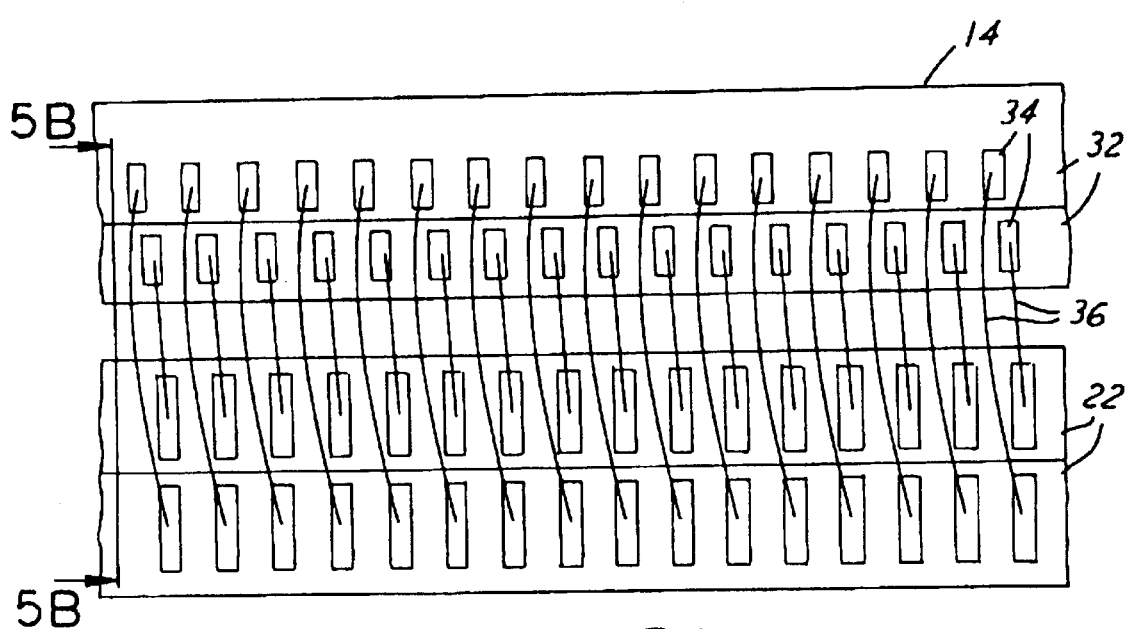
FIG. 5A is a top view of a portion of the high density wirebond connector assembly illustrated in FIG. 1.
Figure 5B:
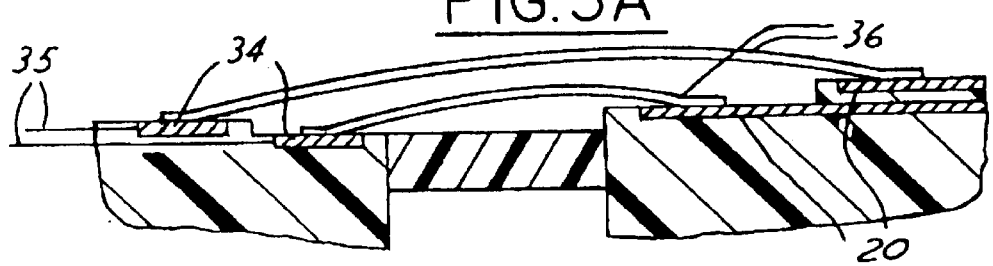
FIG. 5B is a cross-sectional illustration of the portion of the high density wirebond connector assembly illustrated in FIG. 5A.

Referring now to FIG. 5, which is a top view of the high density wirebond connector assembly 10. The high density connector 16 is mounted to the high density wirebond connector assembly 10 such that the shelves 22 of the high density connector 16 are approximately in the same plane as the circuit board 14. The circuit board 14 is comprised of a plurality of laminate layers 32. The embodiment is shown with two laminate layers 32, however, in other embodiments, additional or fewer layers may be used. Wirebond pads 34 are positioned in rows along the circuit board 14. In one embodiment the wirebond pads 34 are preferably arranged in two rows, although they may be arranged in additional or fewer rows. By positioning individual rows of wirebond pads 34 on separate laminate layers 32, the wirebond pads 34 may be placed in close proximity to each other and in close proximity to the high density connector 16. In common wirebond arrangements the wirebond pads 34 could not be positioned in such a close knit arrangement since their electrical paths through the circuit board would interfere with each other. The laminate layers 32 allow electrical paths 35 to pass beneath each other without interference.

The shelf end 27 of the high density connector 16 allows the pin contacts 20 to be placed in closer proximity to the circuit board 18. Unlike known high density connector designs, the present embodiment allows the high density connector 16 to be mounted perpendicular to the circuit board 18 allowing for a reduced profile of the high density wirebond connector assembly 10. In addition, the use of the shelves 22 reduces the vertical distances between the pin contacts 20 and the wirebond pads 34 as well as creates a high density surface of pin contacts 20 that further reduces the distances to the wirebond pads 34. The close proximity of the pin contacts 20 in the present invention in combination with the wirebond pads 34 positioned in a tight pattern allow short wirebonds 36 to attach the each pin contact 20 to its corresponding wirebond pad 34. The resulting high density wirebond connector assembly 10 therefore provides a larger number of pin contacts 20 in a smaller connector housing 18 while providing improved vibrational characteristics by reducing the length of the wirebonds 36. By minimizing the vertical distance of the wirebonds 36, the arc of the wirebonds 36 is reduced which is also known to improve their vibrational resiliency. In addition, since a complex high density connector 16 design is not required to limit the length of the wirebonds 36, a cost savings is realize over known designs.

The wirebonds 36 used in the present embodiment are preferably of about 0.010 inch diameter aluminum. In other embodiments, however a variety of different diameter wirebonds and wirebond materials are possible. A wide variety of various patterns and densities may be utilized. The present embodiment provides a vibrationally resistant wirebondable connector assembly 10 that is smaller than many present designs. The reduction in size of the high density connector 16 can result in a reduction in weight of the overall high density connector assembly 10. The ability to mount the high density connector 16 perpendicular to the circuit board 18 further allows the profile of the high density connector assembly 10 to be reduced. The improved connection density, vibrational resiliency, size, weight, and cost savings associated with this invention make it suitable for a variety of electronic applications.

While particular embodiments of the invention have been shown and described, numerous variations and alternate embodiments will occur to those skilled in the art. Accordingly, it is intended that the invention be limited only in terms of the appended claims.

What is claimed is:

1. A high density connector assembly comprising:
    a connector housing;
    a plurality of pin contacts formed in rows within said connector housing, every two of said rows merging into a single shelf to provide a high density contact surface;
    a circuit board having a first laminate layer and a second laminate layer;
    a plurality of wirebond pads, each of said wirebond pads connected to a corresponding electrical path, each of said wirebond pads forming a signal contact for one of said pin contacts, said wirebond pads being formed on said first laminate layer and said second laminate layer such that said electrical paths of said wirebond pads formed on said first laminate layer pass underneath said electrical paths of said wirebond pads formed on said second laminate layer allowing said plurality of wirebond pads to be placed in closer proximity to said plurality of pin contacts; and
    a plurality of wirebonds, each wirebond connecting one the plurality of pin contacts with one of said plurality of wirebond pads.

2. A high density connector assembly as described in claim 1, wherein said plurality of pin contacts include four rows of pin contacts.

3. A high density connector assembly as described in claim 1, wherein said plurality of wirebond pads are arranged in two rows.

4. A high density connector assembly as described in claim 1, wherein said plurality of pin contacts are positioned at regular intervals within said connector housing.

5. A high density connector assembly as described in claim 1, wherein for every two rows of said plurality of pin contacts there is one row of said plurality of wirebond pads.

6. A high density connector assembly as described in claim 1, wherein said connector housing and said circuit board are both attached to a component housing.

7. A high density connector assembly as described in claim 1, wherein said pin contacts include straight pins and angularly shaped pins.

8. A high density connector assembly as described in claim 1 wherein said connector housing is mounted perpendicular to said circuit board.

9. A high density connector assembly as described in claim 1 further comprising:
    a top shelf; and
    a bottom shelf, said plurality of pin contacts positioned on said bottom shelf being longer than said plurality of pin contacts positioned on said top shelf.

10. A high density connector assembly comprising:
    a connector housing having a plug end and a shelf end;
    a plurality of pin contacts formed in rows within said shelf end of said connector housing, every two of said rows merging into a single shelf to provide a high density contact surface;
    a circuit board having a first laminate layer and a second laminate layer;
    a plurality of wirebond pads, each of said wirebond pads connected to a corresponding electrical path, each of said wirebond pads forming a signal contact for one of said pin contacts, said wirebond pads being formed on said first laminate layer and said second laminate layer such that said electrical paths of said wirebond pads formed on said first laminate layer pass underneath said electrical paths of said wirebond pads formed on said second laminate layer allowing said plurality of wirebond pads to be placed in closer proximity to said plurality of pin contacts; and
    a plurality of wirebonds, each wirebond connecting one the plurality of pin contacts with one of said plurality of wirebond pads.

11. A high density connector assembly as described in claim 10, wherein said plurality of pin contacts include four rows of pin contacts.

12. A high density connector assembly as described in claim 10, wherein said plurality of wirebond pads are arranged in two rows.

13. A high density connector assembly as described in claim 10, wherein said plurality of pin contacts are positioned at regular intervals within said connector housing.

14. A high density connector assembly as described in claim 10, wherein for every two rows of said plurality of pin contacts there is one row of said plurality of wirebond pads.

15. A high density connector assembly as described in claim 10, wherein said connector housing and said circuit board are both attached to a component housing.

16. A high density connector assembly as described in claim 10, wherein said pin contacts include straight pins and angularly shaped pins.

17. A high density connector assembly as described in claim 10 wherein said connector housing is mounted perpendicular to said circuit board.

18. A high density connector assembly as described in claim 10 further comprising:
    a top shelf; and
    a bottom shelf, said plurality of pin contacts positioned on said bottom shelf being longer than said plurality of pin contacts positioned on said top shelf.

19. A method of forming a high density connector assembly including a component housing, a connector housing, a plurality of rows of pin contacts positioned within the connector housing, a circuit board having a plurality of laminate layers, a plurality of wirebond pads formed on the plurality of laminate layers, each of the wirebond pads connected to a corresponding electrical path, and a plurality of wirebonds, comprising the steps of:
    attaching the connector housing and the circuit board to the component housing such that the connector housing is generally perpendicular to the circuit board;
    merging two rows of the plurality of pin contacts onto a single shelf to provide a high density contact surface;
    placing the plurality wirebond pads on a first laminate layer and a second laminate layer such that said electrical paths of said wirebond pads formed on said first laminate layer pass underneath said electrical paths of said wirebond pads formed on said second laminate layer allowing said plurality of wirebond pads to be placed in closer proximity to said plurality of pin contacts;
    connecting each of said plurality of pin contacts with one of said plurality of wirebond pads using said wirebonds.

* * * * *